(12) United States Patent
Simsek-Ege et al.

(10) Patent No.: US 10,381,363 B2
(45) Date of Patent: Aug. 13, 2019

(54) METHODS FOR FORMING A STRING OF MEMORY CELLS AND APPARATUSES HAVING A VERTICAL STRING OF MEMORY CELLS INCLUDING METAL

(71) Applicant: Micron Technology, Inc., Boise, ID (US)

(72) Inventors: Fatma Arzum Simsek-Ege, Boise, ID (US); Akira Goda, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/707,749

(22) Filed: May 8, 2015

(65) Prior Publication Data

US 2015/0243671 A1    Aug. 27, 2015

Related U.S. Application Data

(62) Division of application No. 13/894,631, filed on May 15, 2013, now Pat. No. 9,041,090.

(51) Int. Cl.
*H01L 29/788* (2006.01)
*H01L 27/1157* (2017.01)
(Continued)

(52) U.S. Cl.
CPC .... *H01L 27/11556* (2013.01); *H01L 27/1052* (2013.01); *H01L 27/1157* (2013.01);
(Continued)

(58) Field of Classification Search
CPC ........... H01L 29/42332; H01L 27/1052; H01L 29/66825; H01L 29/66833;
(Continued)

(56) References Cited

U.S. PATENT DOCUMENTS 6,063,666 A * 5/2000 Chang ............... H01L 21/28202
257/E21.209
7,829,935 B2 * 11/2010 Makihara ............... B82Y 10/00
257/321

(Continued)

OTHER PUBLICATIONS

"International Application Serial No. PCT/US2014/011228, International Search Report and Written Opinion dated Apr. 30, 2014", 17 pgs.

(Continued)

*Primary Examiner* — Marcos D. Pizarro
*Assistant Examiner* — Nelson Garces
(74) *Attorney, Agent, or Firm* — Schwegman Lundberg & Woessner, P.A.

(57) ABSTRACT

A method for forming a string of memory cells, a memory device having a string of memory cells, and a system are disclosed. The string of memory cells can include a string of planar memory cells formed as recesses in each of a plurality of control gate material formed as a vertical stack of alternating insulator and control gate material. The recesses can be lined with a dielectric material and filled with a floating gate material. Metal nano-particles can be formed on a surface of the floating gate material and/or infused into the floating gate material.

17 Claims, 17 Drawing Sheets

(51) Int. Cl.

| | |
|---|---|
| *H01L 27/11524* | (2017.01) |
| *H01L 27/11529* | (2017.01) |
| *H01L 27/11556* | (2017.01) |
| *H01L 27/11582* | (2017.01) |
| *H01L 29/792* | (2006.01) |
| *H01L 29/66* | (2006.01) |
| *H01L 27/105* | (2006.01) |
| *H01L 29/423* | (2006.01) |

(52) U.S. Cl.
CPC .. *H01L 27/11524* (2013.01); *H01L 27/11529* (2013.01); *H01L 27/11582* (2013.01); *H01L 29/42332* (2013.01); *H01L 29/66825* (2013.01); *H01L 29/788* (2013.01); *H01L 29/7889* (2013.01); *H01L 29/792* (2013.01); *H01L 29/7926* (2013.01); *H01L 29/66833* (2013.01)

(58) Field of Classification Search
CPC ......... H01L 27/11521; H01L 27/11524; H01L 27/11529; H01L 27/11551–27/11556; H01L 27/11582; H01L 29/7926; H01L 21/28273; H01L 29/788–29/7889
USPC .................................................. 257/310–330
See application file for complete search history.

(56) References Cited

U.S. PATENT DOCUMENTS

| | | | |
|---|---|---|---|
| 8,437,192 B2 | 5/2013 | Lung et al. | |
| 8,507,976 B2 | 8/2013 | Joo | |
| 9,041,090 B2 | 5/2015 | Simsek-Ege et al. | |
| 2007/0004140 A1 | 1/2007 | Jang et al. | |
| 2008/0009113 A1 | 1/2008 | Shimizu et al. | |
| 2008/0179659 A1 | 7/2008 | Enda et al. | |
| 2009/0230454 A1 | 9/2009 | Pekny | |
| 2009/0289297 A1 | 11/2009 | Kim et al. | |
| 2009/0310425 A1 | 12/2009 | Sim et al. | |
| 2010/0013049 A1* | 1/2010 | Tanaka | H01L 21/76816 257/532 |
| 2010/0019310 A1* | 1/2010 | Sakamoto | H01L 27/11578 257/324 |
| 2010/0044776 A1* | 2/2010 | Ishiduki | H01L 27/11565 257/324 |
| 2010/0059811 A1* | 3/2010 | Sekine | H01L 21/28282 257/324 |
| 2010/0171162 A1 | 7/2010 | Katsumata et al. | |
| 2010/0237402 A1* | 9/2010 | Sekine | H01L 27/11551 257/324 |
| 2011/0059595 A1* | 3/2011 | Jung | H01L 29/66833 438/430 |
| 2011/0090737 A1* | 4/2011 | Yoo | G11C 16/0483 365/185.11 |
| 2011/0193153 A1 | 8/2011 | Higuchi et al. | |
| 2011/0316064 A1 | 12/2011 | Kim et al. | |
| 2012/0012921 A1 | 1/2012 | Liu | |
| 2012/0068247 A1 | 3/2012 | Lee et al. | |
| 2012/0175697 A1 | 7/2012 | Hall et al. | |
| 2012/0184078 A1 | 7/2012 | Kiyotoshi | |
| 2012/0211823 A1* | 8/2012 | Lim | H01L 27/11565 257/326 |
| 2012/0220088 A1 | 8/2012 | Alsmeier | |
| 2012/0231593 A1 | 9/2012 | Joo et al. | |
| 2012/0241842 A1 | 9/2012 | Matsuda | |
| 2012/0329224 A1 | 12/2012 | Kong et al. | |
| 2013/0087843 A1* | 4/2013 | Han | B82Y 10/00 257/315 |
| 2014/0061750 A1* | 3/2014 | Kwon | H01L 27/1052 257/314 |
| 2014/0252447 A1* | 9/2014 | Lee | H01L 29/66825 257/316 |
| 2014/0339621 A1 | 11/2014 | Simsek-Ege et al. | |

OTHER PUBLICATIONS

U.S. Appl. No. 13/894,481, filed May 15, 2013, Micron Matter.
U.S. Appl. No. 13/894,631 U.S. Pat. No. 9,041,090, filed May 15, 2013, Methods for Forming a String of Memory Cells and Apparatuses Having a Vertical String of Memory Cells Including Metal.

* cited by examiner

| | |
|---|---|
| SGS | ~304 |
| INSULATOR | ~303 |
| BUFFER | ~302 |
| | |
| SOURCE | ~301 |

METHODS FOR FORMING A STRING OF MEMORY CELLS AND APPARATUSES HAVING A VERTICAL STRING OF MEMORY CELLS INCLUDING METAL

PRIORITY APPLICATION

This application is a divisional of U.S. application Ser. No. 13/894,631, filed May 15, 2013, which is incorporated herein by reference in its entirety.

TECHNICAL FIELD

The present embodiments relate generally to memory and a particular embodiment relates to three-dimensional planar cell integration.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that allows for high memory densities, high reliability, and low power consumption. Changes in threshold voltage of the cells, through programming of a charge storage structure, such as floating gates, trapping layers or other physical phenomena, determine the data state of each cell.

Due to ever increasing system speeds, memory manufacturers are under pressure to increase the bandwidth of their memory devices so that the memory does not become a speed bottleneck for the system. Memory manufacturers are also under pressure to constantly increase the memory density of the memory devices while maintaining, or even shrinking, the memory device size.

One way to increase both memory bandwidth and density is a three-dimensional structure in which the memory devices are fabricated vertically. FIG. 1 illustrates a cross-sectional view of a typical prior art semiconductor fabrication process for a memory cell string. The illustrated process can be used to vertically fabricate two strings of memory cells 120, 121.

The process forms an oxide 101 on a substrate 100. A polysilicon material 102 can be used as a select gate source (SGS) transistor for the strings of memory cells 120, 121. An etch stop material 103, formed over the polysilicon material 102, can provide an etch resistance for the polysilicon material 102 in order to slow the etching process in a future etching step.

Alternating layers 104-114 of an oxide 104, 106, 108, 110, 112 and a polysilicon 105, 107, 109, 111, 113 are formed over the etch stop 103. The polysilicon material 105, 107, 109, 111, 113 can be used as the control gates for the memory cells of the strings of memory cells 120, 121. The oxide material 104, 106, 108, 110, 112 can be used to insulate control gates of adjacent memory cells. A polysilicon material 115 is formed on top of the last oxide material 114. The top polysilicon material 115 can be used as a select gate drain transistor in the string of memory cells 120, 121.

A vertical channel 116 is formed through the top polysilicon material 115, the alternating layers of oxide and polysilicon 104-114, the etch stop layer 103, the SGS polysilicon 102, and the oxide layer 101. For purposes of clarity, only one string of memory cells 120, and only one memory cell 140 of that string 120, is subsequently described.

Recesses 130 of approximately 25 nm are formed into the control gate polysilicon 105, 107, 109, 111, 113. Each recess 130 is lined with an oxide material and filled with a polysilicon floating gate material. A polysilicon material 131 lines the vertical channel walls to connect the memory cells of the string to the lower SGS material and an oxide material is formed on the surface of the polysilicon to act as an insulator. The channel 116 is filled with a polysilicon material that is integrated with the SGS material.

Vertical fabrication of memory cell strings can enable manufacturers to form more memory cells on a memory die as compared to horizontally formed memory cell strings. While the vertically formed string of memory cells can increase memory density, using the typical prior art fabrication materials and techniques may not increase memory performance.

DETAILED DESCRIPTION

Figure 1:
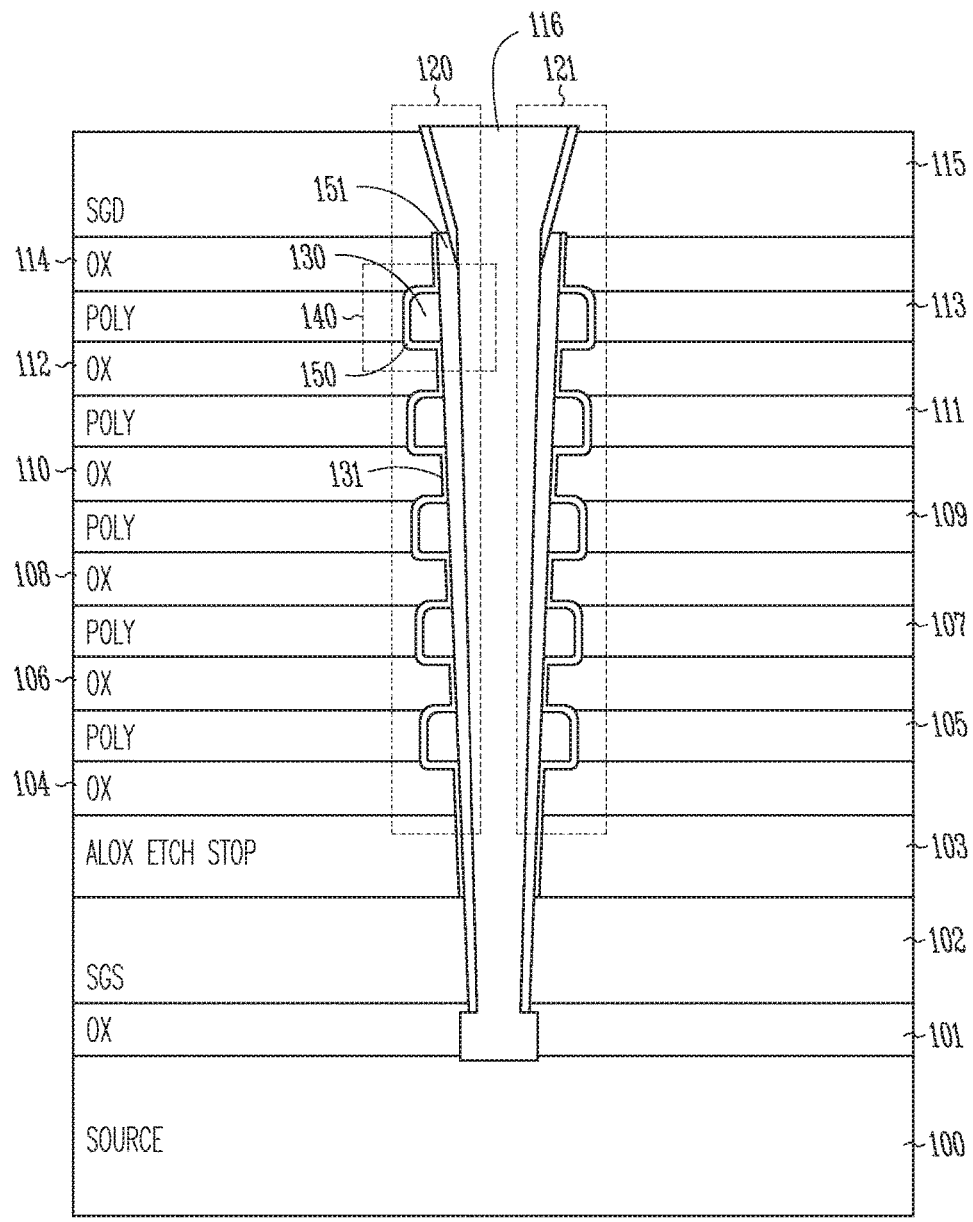
FIG. 1 illustrates a cross-sectional view of a typical prior art semiconductor fabrication process for a memory cell string.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
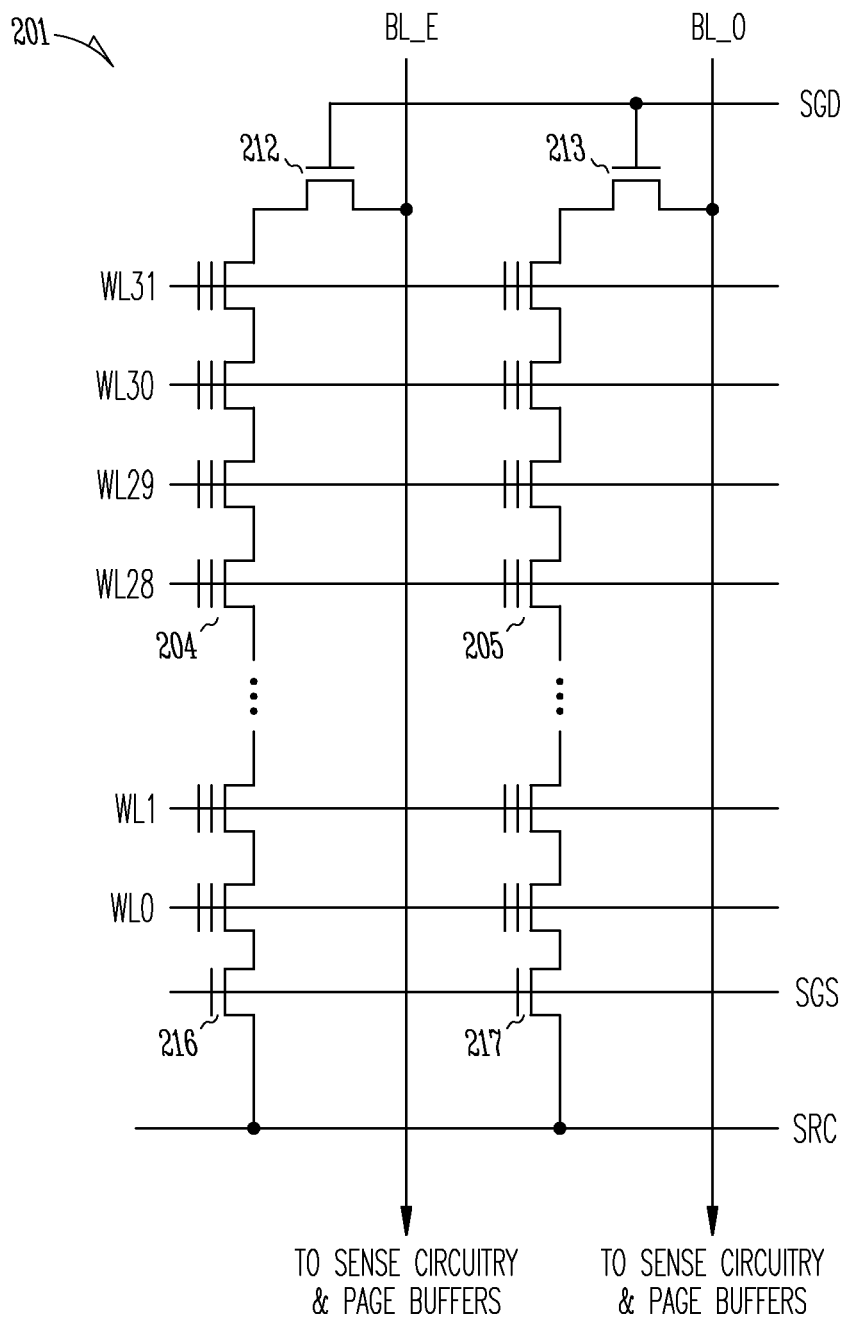
FIG. 2 illustrates a schematic diagram of one embodiment of strings of memory cells.

FIG. 2 illustrates a schematic diagram of one embodiment of a portion of a NAND architecture memory array 201 comprising strings of non-volatile memory cells. The NAND architecture is for purposes of illustration only as the embodiments disclosed herein are not limited to any one memory architecture. In one embodiment, the memory array is formed as a three-dimensional architecture so that each string can be formed vertically as described subsequently.

The memory array 201 comprises an array of non-volatile memory cells (e.g., floating gate) arranged in columns such as strings 204, 205. Each of the cells is coupled drain to source in each string 204, 205. An access line (e.g., word line) WL0-WL31, that spans across multiple strings 204, 205, is coupled to the control gates of each memory cell in a row in order to bias the control gates of the memory cells in the row. Odd and even data lines (e.g., bit lines) BL_O and BL_E are coupled to the strings 204, 205 through drain select gates 212, 213 (e.g., transistors) that are controlled by a drain select gate control signal SGD coupled to their control gates. The bit lines BL_O and BL_E are eventually coupled to sense circuitry and page buffers (not shown) that detect and store the state of each cell by sensing current or voltage on a selected bit line.

Each string 204, 205 of memory cells is coupled to a source line SRC through a source select gate 216, 217 (e.g., transistor). The source select gates 216, 217 are controlled by a source select gate control signal SGS coupled to their control gates.

Each memory cell can be individually programmed as either a single level cell (SLC) or a multiple level cell (MLC). A cell's threshold voltage ($V_t$) can be used as an indication of the data stored in the cell. For example, in an SLC memory device, a $V_t$ of 2.5V may indicate a programmed cell while a $V_t$ of −0.5V may indicate an erased cell. In an MLC memory device, multiple $V_t$ ranges can each indicate a different state by assigning a bit pattern to a specific $V_t$ range.

In order to increase memory die density, the strings of memory cells 204, 205 can be formed vertically as described subsequently. Performance of the memory cells (e.g., programming/erase speed) can be enhanced by the addition of metal to the floating gates using a subsequently described fabrication technique.

Figures 3, 4:
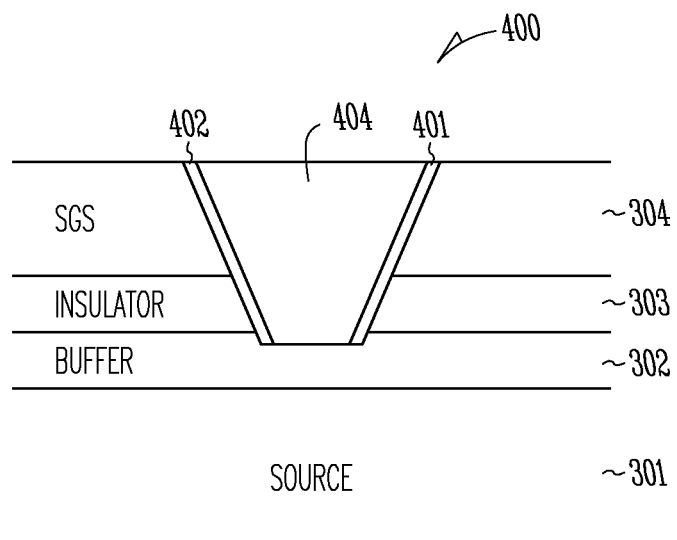
FIG. 3 illustrates fabrication steps for forming vertical strings of memory cells.
FIG. 4 illustrates additional fabrication steps for forming vertical strings of memory cells.

FIG. 3 illustrates fabrication steps for forming vertical strings of memory cells. The source line 301 is formed in a semiconductor (e.g., doped polycrystalline silicon (polysilicon)). The source line 301 can be doped into the semiconductor substrate or formed on a semiconductor substrate. In one embodiment, the source line 301 can have a thickness in a range of 50-100 nm.

A buffer material 302 can be formed on the source line 301. The buffer material 302 can be an n+ doped polysilicon. The buffer material 302 can be used to isolate the source line 301. In one embodiment, the buffer material 302 can be approximately 10 nm thick.

An insulator material 303 can be formed on the buffer material 302. If the buffer material 302 is not used, the insulator material 303 can be formed on the source line 301. In one embodiment, the insulator material 303 can be an approximately 20 nm thick oxide that can be grown, by oxidation of a material, or deposited.

A source select gate (SGS) material 304 can be formed on the insulator material 303. The SGS material 304 can be a p− doped polysilicon into which source select gates are subsequently formed. In one embodiment, the SGS material 304 can be approximately 150 nm thick.

FIG. 4 illustrates additional fabrication steps for forming vertical strings of memory cells. A trench 400 can be formed into the buffer material 302, the insulator 303, and the SGS material 304. An oxide 401, 402 can be formed along the sides of the trench 400. The trench can then be filled with a semiconductor material 404 (e.g., polysilicon). The oxide 401, 402 can be either deposited or grown. If the buffer material 302 is not present, an oxide material may be formed at the bottom of the channel to isolate the polysilicon fill material 404 from the source line material 301.

Figure 5:
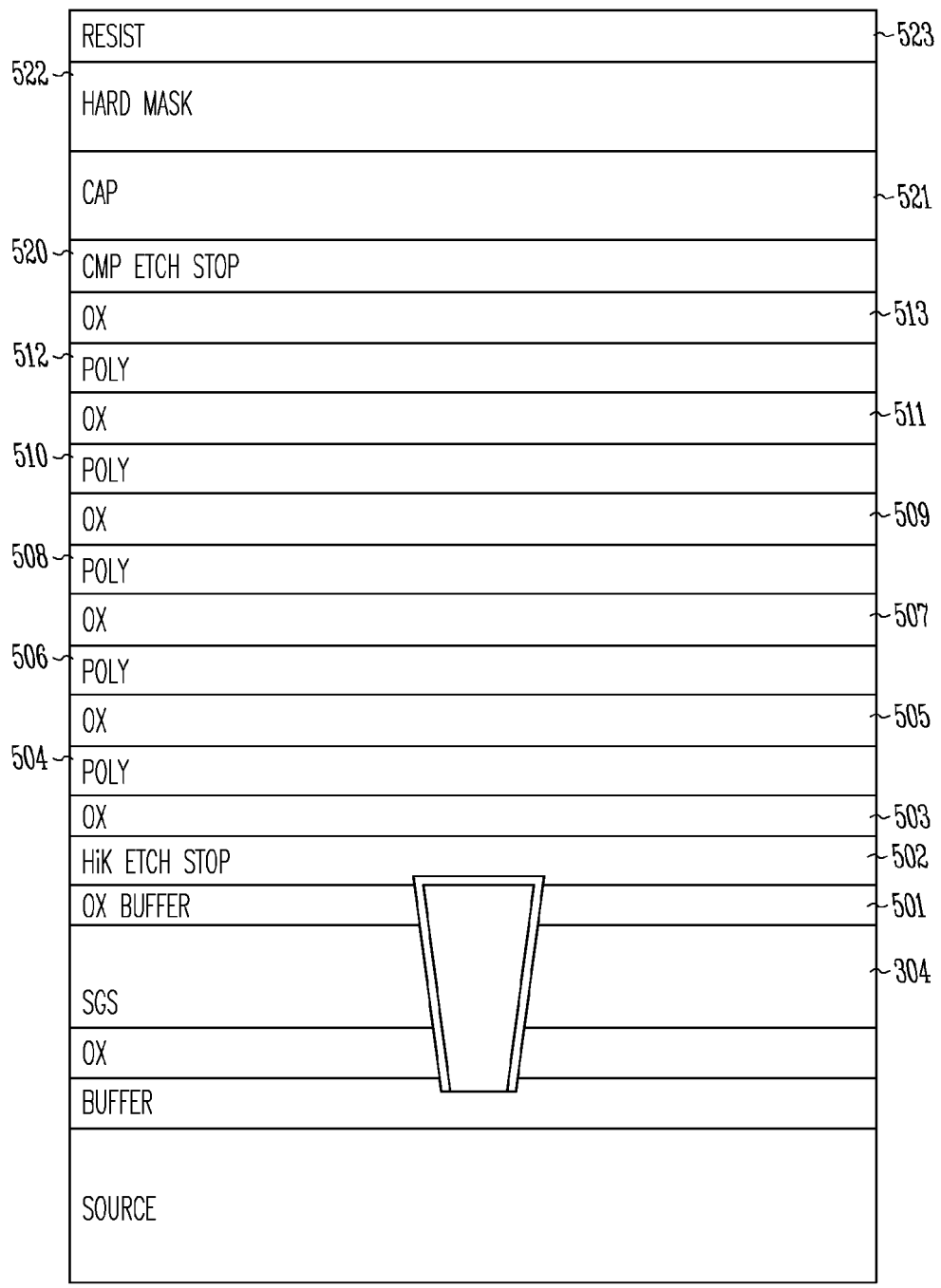
FIG. 5 illustrates additional fabrication steps for forming vertical strings of memory cells.

FIG. 5 illustrates additional fabrication steps for forming vertical strings of memory cells. An oxide buffer 501 can be formed on the SGS material 304. The SGS polysilicon 304 can be formed separately between oxide materials 303, 501 to prevent metal growth on the SGS polysilicon 304. A high-K dielectric material 502, used as an etch stop material, can be formed on the oxide 501. In one embodiment, the oxide buffer 501 can be formed approximately 10 nm thick and the high-K dielectric material 502 can be formed approximately 30 nm thick. Alternate embodiments can use other dimensions.

A plurality of vertically stacked, alternating layers of insulators (e.g., oxide material) 503, 505, 507, 509, 511, 513 and control gate materials (e.g., polysilicon) 504, 506, 508, 510, 512 can be formed on the etch stop material 502. In one embodiment, each insulator 503, 505, 507, 509, 511, 513 can be used to insulate between adjacent control gate material 504, 506, 508, 510, 512 of the memory cells. In one embodiment, the insulators 503, 505, 507, 509, 511, 513 can be formed approximately 20 nm thick while the control gate material 504, 506, 508, 510, 512 can be formed approximately 30 nm thick. Alternate embodiments can use other dimensions. The insulators 503, 505, 507, 509, 511, 513 can be formed by deposition or grown. In one embodiment, the control gate material 504, 506, 508, 510, 512 can be an n-type polysilicon.

The use of oxide for the insulators and polysilicon for the control gate material is for purposes of illustration only. Alternate embodiments can use other materials for the insulators that have insulation properties and other materials for the control gates that have similar properties to polysilicon.

A chemical mechanical planarization (CMP) material 520 can be formed on the top oxide 513. In one embodiment, the CMP material 520 is an approximately 10 nm thick nitride material that provides a smoothed surface so that the next layer can adhere properly. A capping material 521 can be formed on the CMP material 520 to provide an insulator for subsequent steps. The capping material 521 can be an approximately 120 nm thick oxide, nitride, polysilicon, and or high-K dielectric material. Alternate embodiments can use other dimensions. A hard mask dielectric anti-reflective coating (DARC) 522 can be formed on the capping material 521 and an etch resist 523 formed on top of the DARC 522.

Figure 6:
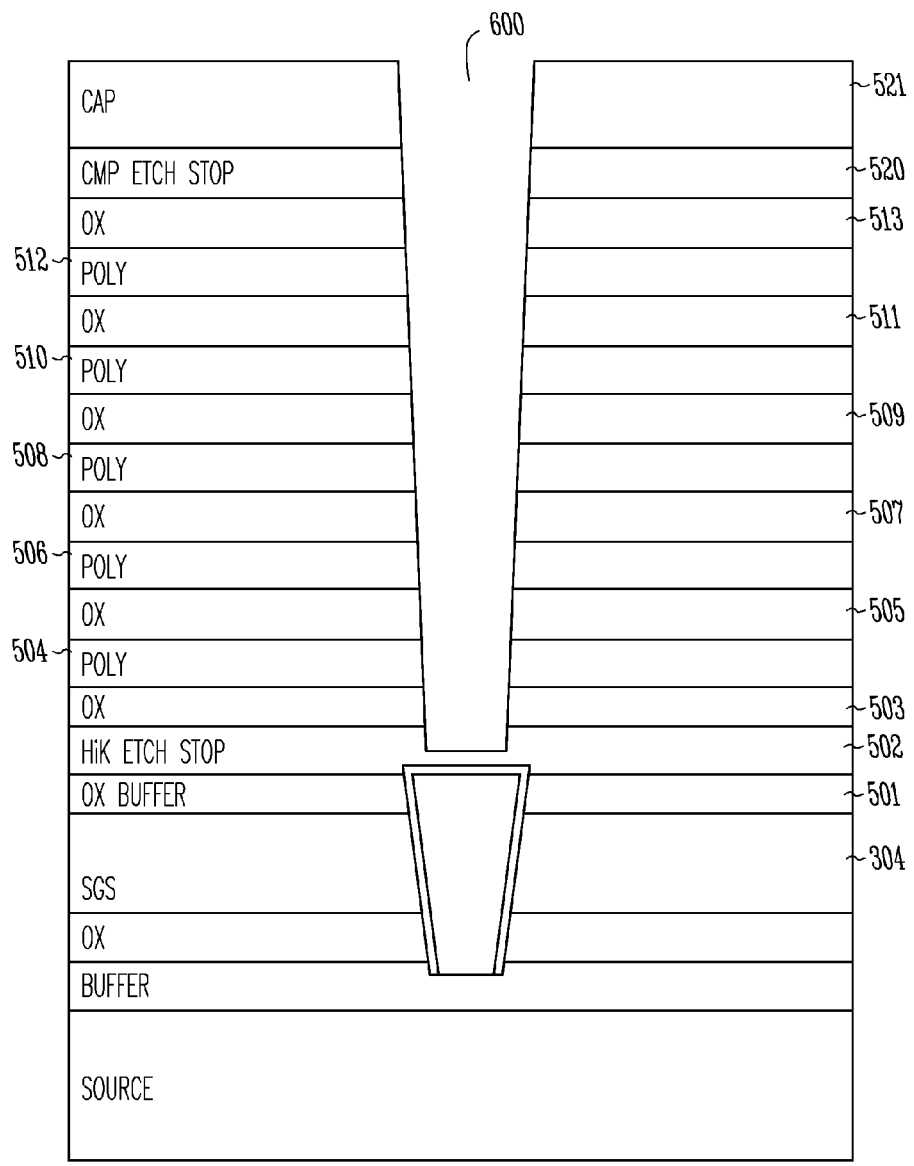
FIG. 6 illustrates additional fabrication steps for forming vertical strings of memory cells.

FIG. 6 illustrates additional fabrication steps for forming vertical strings of memory cells. A channel 600 can be formed through previously formed layers 501-513, 520, 521. A portion of the oxide material 501 can be left between the channel 600 and the top of the filled SGS trench 400 to reduce leakage. The strings of memory cells can be formed subsequently on the sides of the channel 600.

Figure 7:
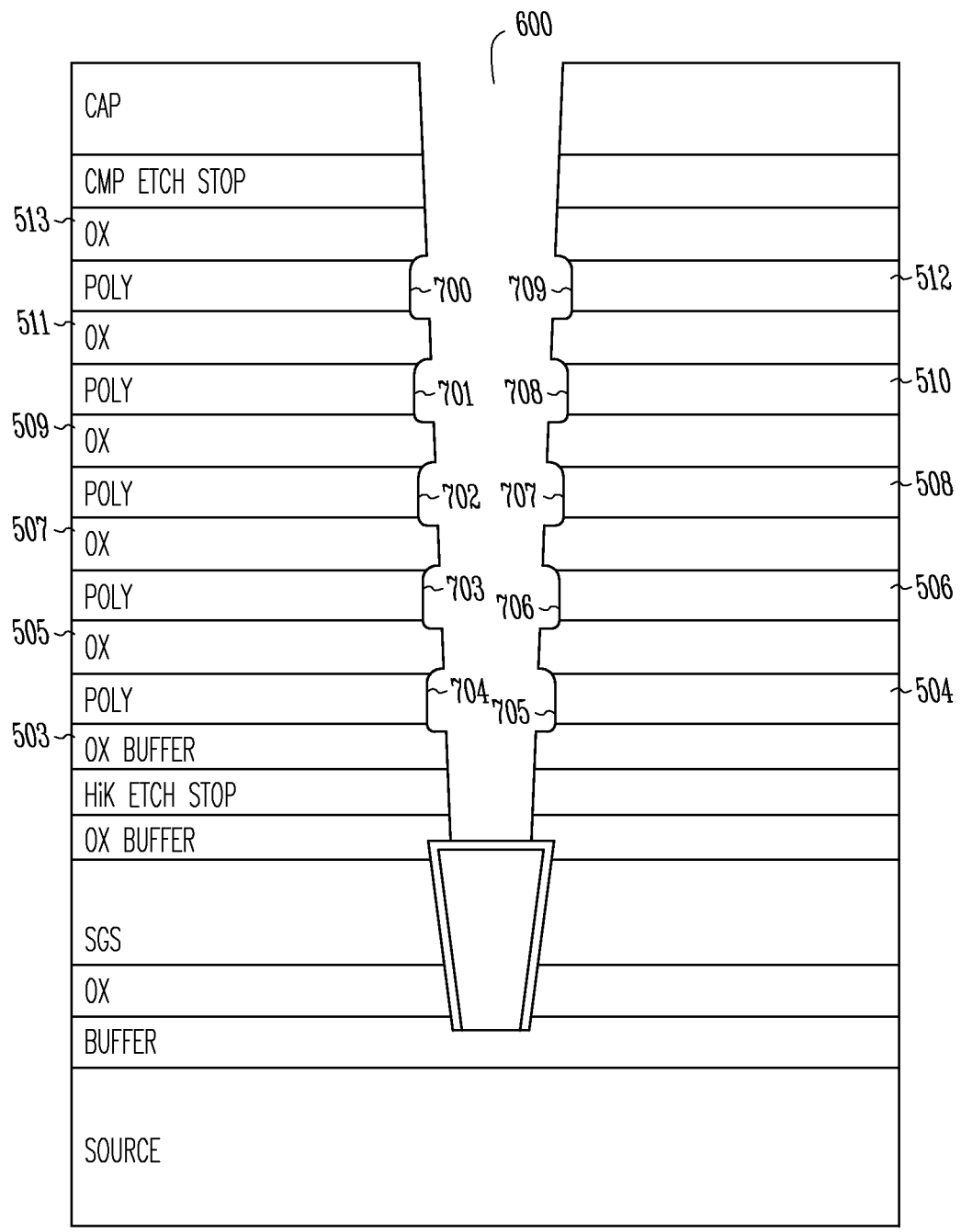
FIG. 7 illustrates additional fabrication steps for forming vertical strings of memory cells.

FIG. 7 illustrates additional fabrication steps for forming vertical strings of memory cells. Directional etching can be used to etch portions of the polysilicon control gate material 504, 506, 508, 510, 512 on the sidewalls of the channel 600 in order to form recesses 700-709 within the control gate material 504, 506, 508, 510, 512 that are bounded on their upper and lower sides by the oxide material 503, 505, 507, 509, 511, 513.

The recesses 700-709 formed in the control gate material 504, 506, 508, 510, 512 can be approximately 15 nm deep. Prior art recesses are typically formed 25 nm deep. Alternate embodiments can use other dimensions.

Figure 8:
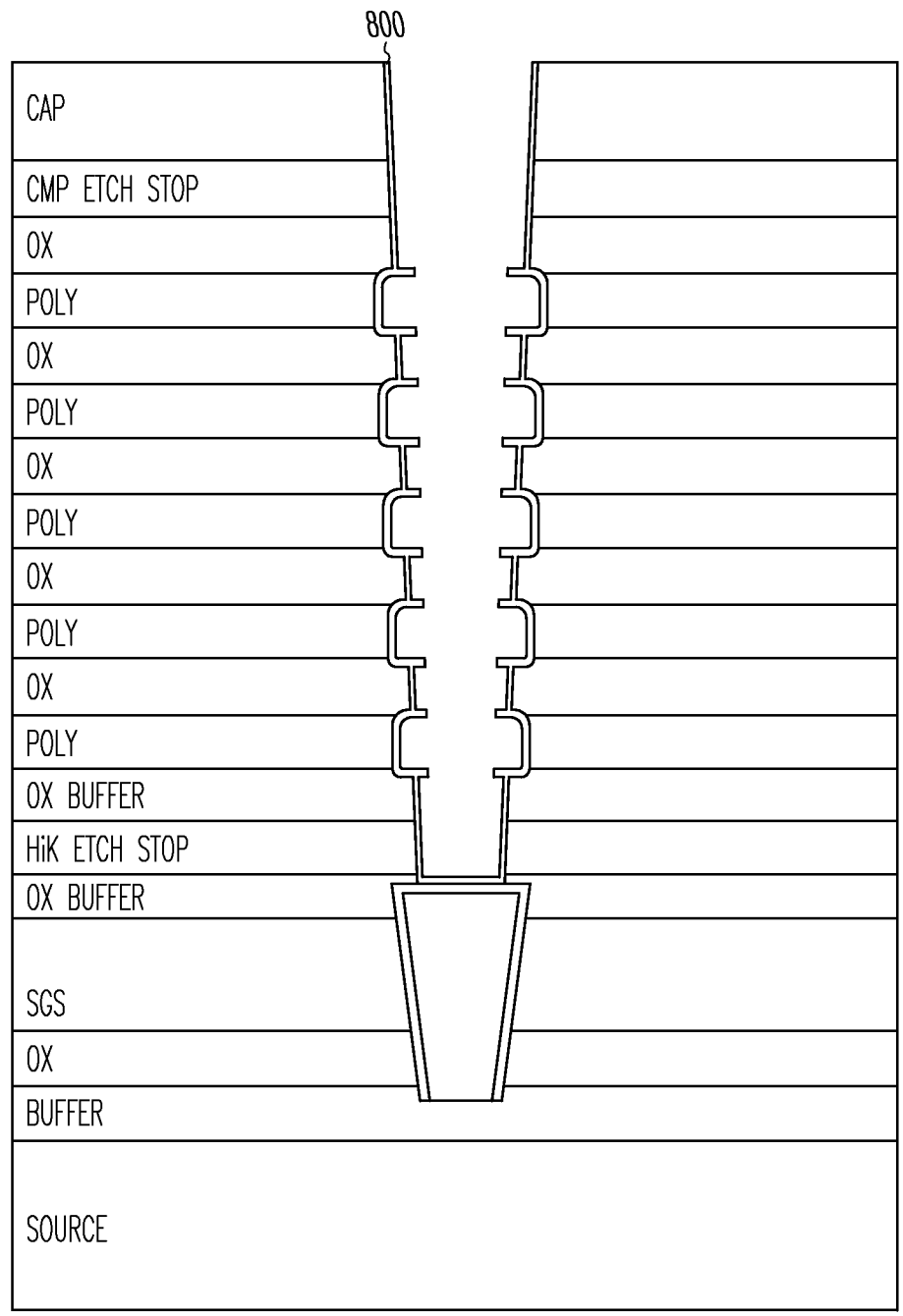
FIG. 8 illustrates an additional fabrication step for forming vertical strings of memory cells.

FIG. 8 illustrates an additional fabrication step for forming vertical strings of memory cells. An interpoly dielectric material 800 can be formed along the sidewalls of the channel 600 such that it lines the recesses 700-709 in the sidewalls. In one embodiment, the interpoly dielectric material 800 can be an oxide-nitride-oxide (ONO) film.

Figure 9:
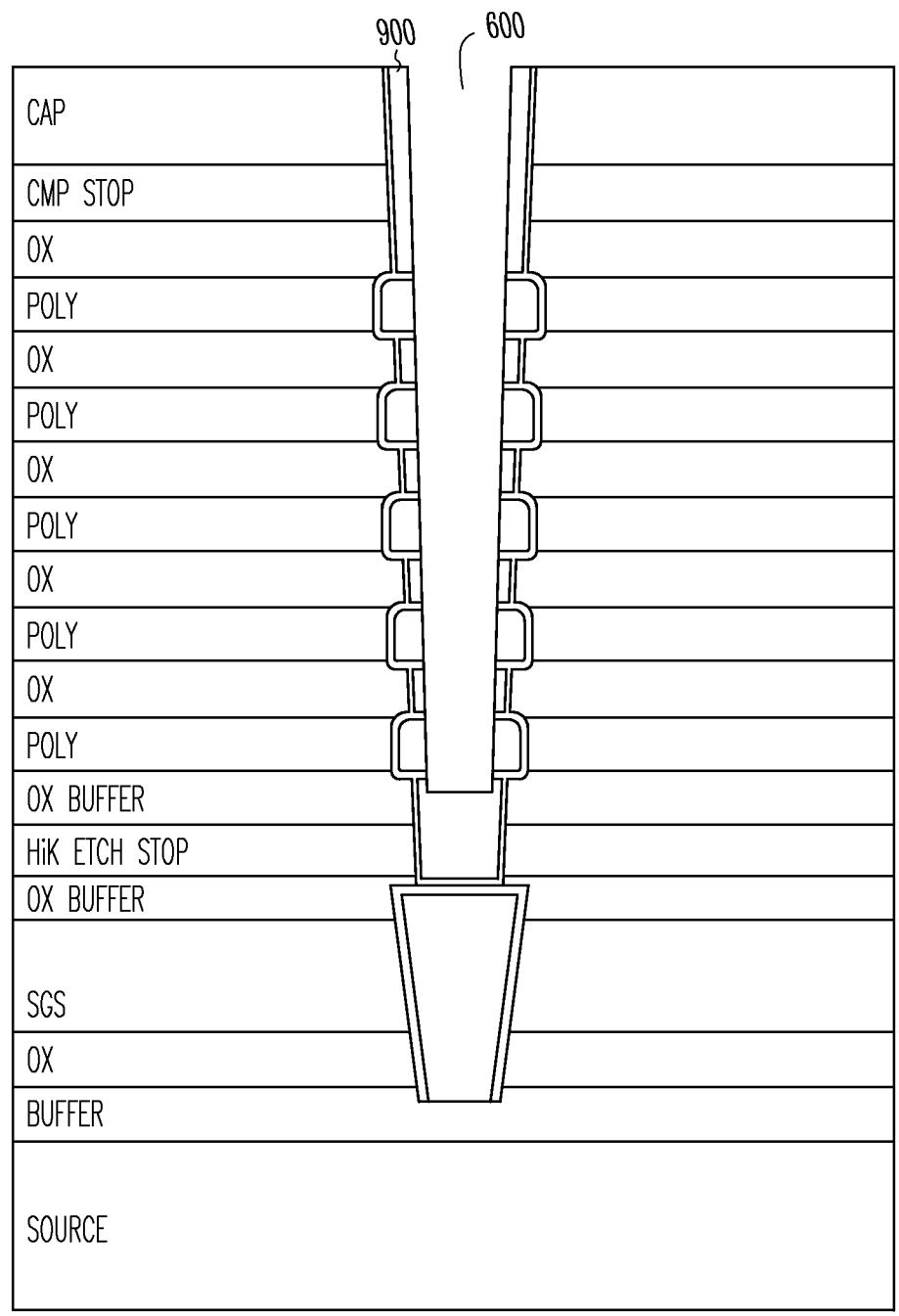
FIG. 9 illustrates an additional fabrication step for forming vertical strings of memory cells.

FIG. 9 illustrates an additional fabrication step for forming vertical strings of memory cells. A floating gate material 900 can be formed along the sidewalls and bottom of the channel 600. The floating gate material 900, in one embodiment, can be a polysilicon material that can be conformally deposited approximately 5-7 nm thick. Alternate embodiments can use other dimensions. The floating gate material 900 can fill the recesses in the sidewalls of the channel 600.

Figure 10:
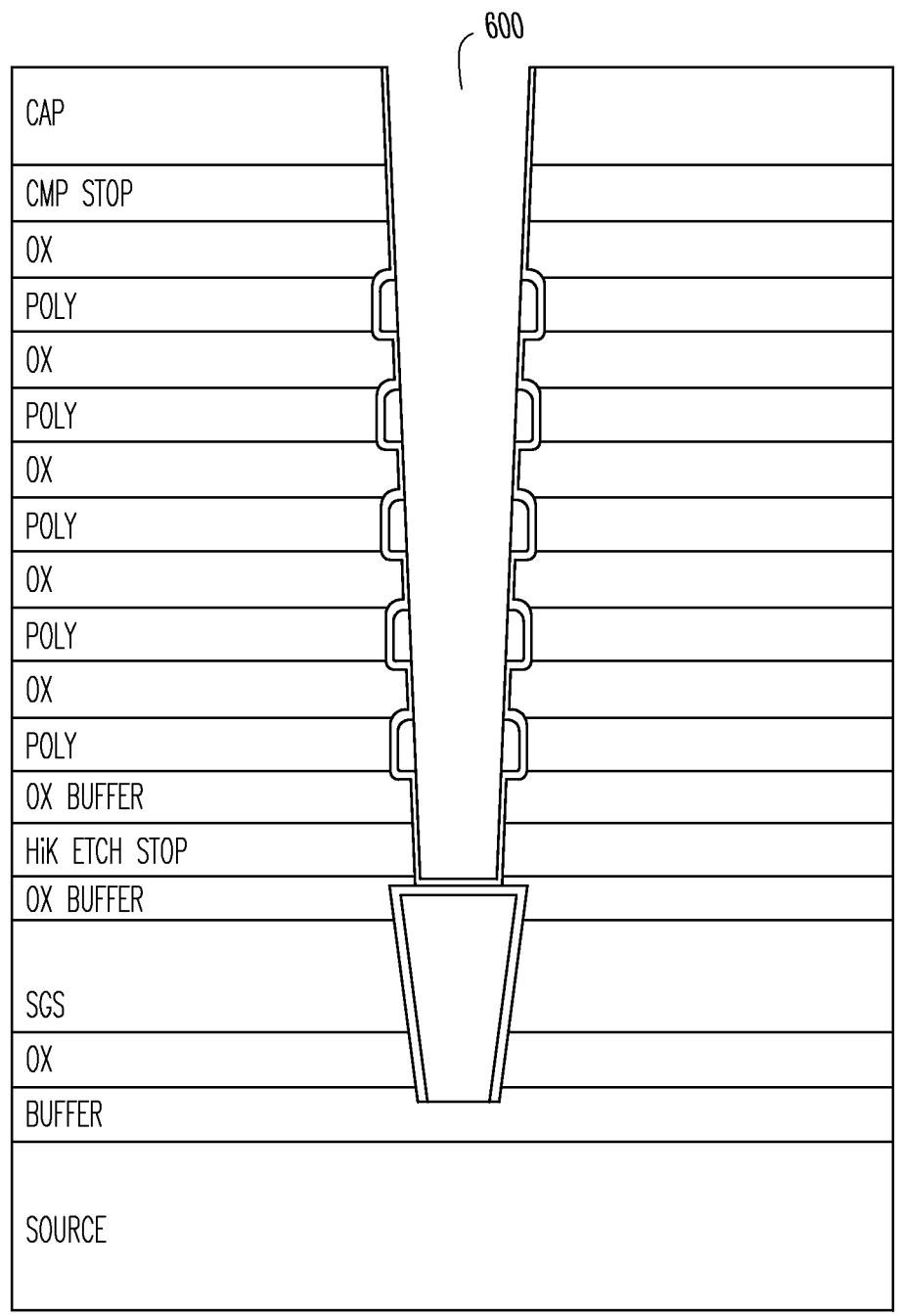
FIG. 10 illustrates an additional fabrication step for forming vertical strings of memory cells.

FIG. 10 illustrates an additional fabrication step for forming vertical strings of memory cells. Excess floating gate material 900 (e.g., polysilicon) can be removed from the sidewalls and bottom of the channel 600 such that only the floating gate material that fills the recesses of the sidewalls remains.

Figure 11:
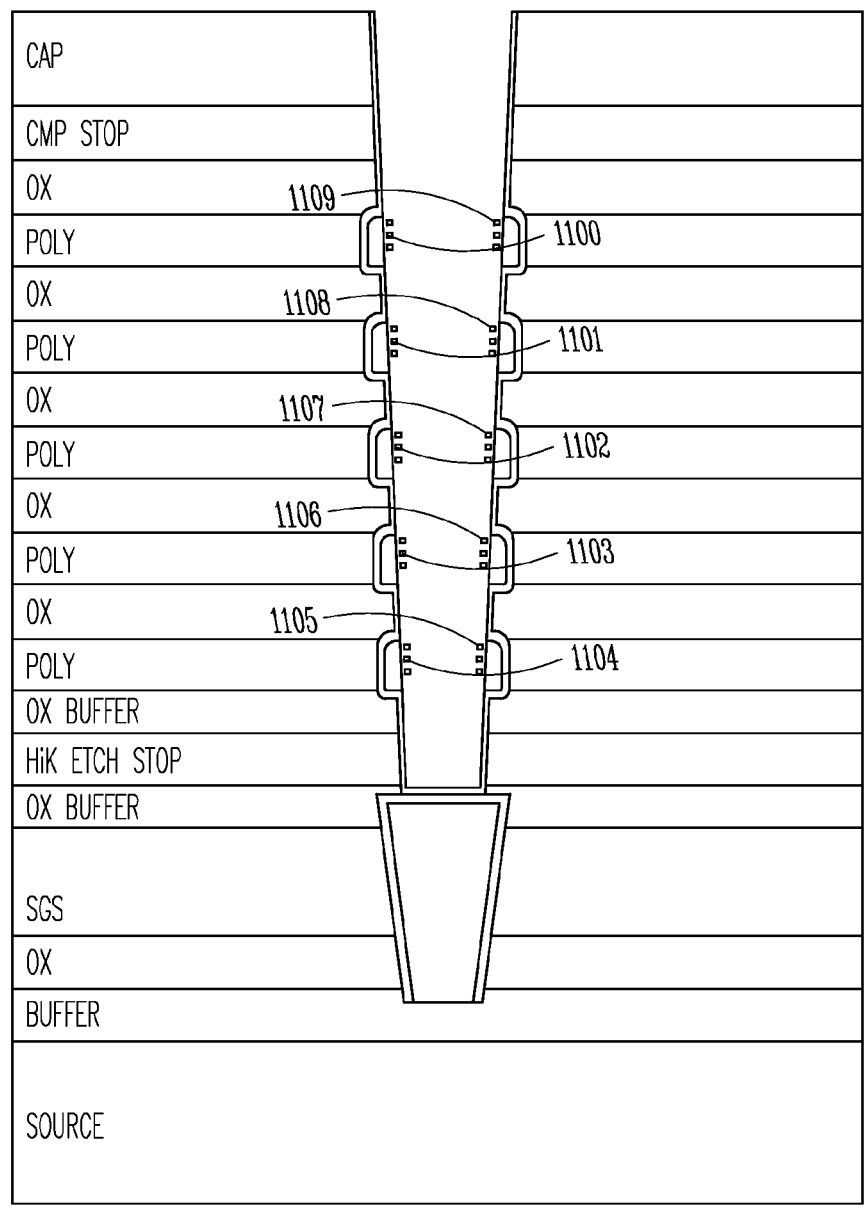
FIG. 11 illustrates additional fabrication steps for forming vertical strings of memory cells.

FIG. 11 illustrates additional fabrication steps for forming vertical strings of memory cells. One step can add metal nano-particles 1100-1109 to the floating gate material formed in each recess. In one embodiment, the metal nano-particles 1100-1109 can be grown selectively (e.g., atomic layer deposition ALD) on the polysilicon material. The entire channel can be exposed to a metal precursor gas and metal nano-particles 1100-1109 can adhere to the polysilicon of the floating gate material more so than the oxide isolation material of the ONO layer between the floating gates.

The excess metal nano-particles can then be cleaned from portions of the channel where it is not desired to have metal nano-particles by a cleaning process (e.g., Ammonia hydroxide-hydrogen Peroxide-water Mixture APM). The cleaning process can be followed by a stabilizing treatment (e.g., nitridization) to stabilize the metal particles uniformly on the floating gate surfaces.

The metal nano-particles 1100-1109 can be either formed on the surface of the floating gate material or infused into the floating gate material. For example, a high temperature anneal process performed after the cleaning process may infuse the nano-particles into the floating gate material.

In one embodiment, metal nano-particles 1100-1109 can be used instead of a metal film in part because the metal nanoparticles 1100-1109 can be easier to clean from portions of the channel where metal nanoparticles are not desirable in order to prevent two or more floating gates from shorting together. Additionally, the metal nanoparticles 1100-1109 can be infused into the polysilicon floating gate material more easily than a metal film. In one embodiment, the nanoparticles can define the charge storage area of each memory cell.

The metal nanoparticles added to the floating gate can include at least one of the following: ruthenium (Ru), ruthenium oxide ($RuO_x$), titanium nitride (TiN), titanium aluminum nitride (TiAlN), tungsten nitride (WN), tungsten carbon nitride (WCN), tungsten silicide ($WSi_x$), tantalum nitride (TaN), tantalum aluminum nitride (TaAlN), ruthenium silicide (RuSi), hafnium silicide (HfSi), hafnium (Hf), zirconium (Zr), zirconium silicide (ZrSi), cobalt silicide (CoSi), or nickel silicide (NiSi). These metals are for purposes of illustration only as the present embodiments are not limited to any one metal.

Figure 12:
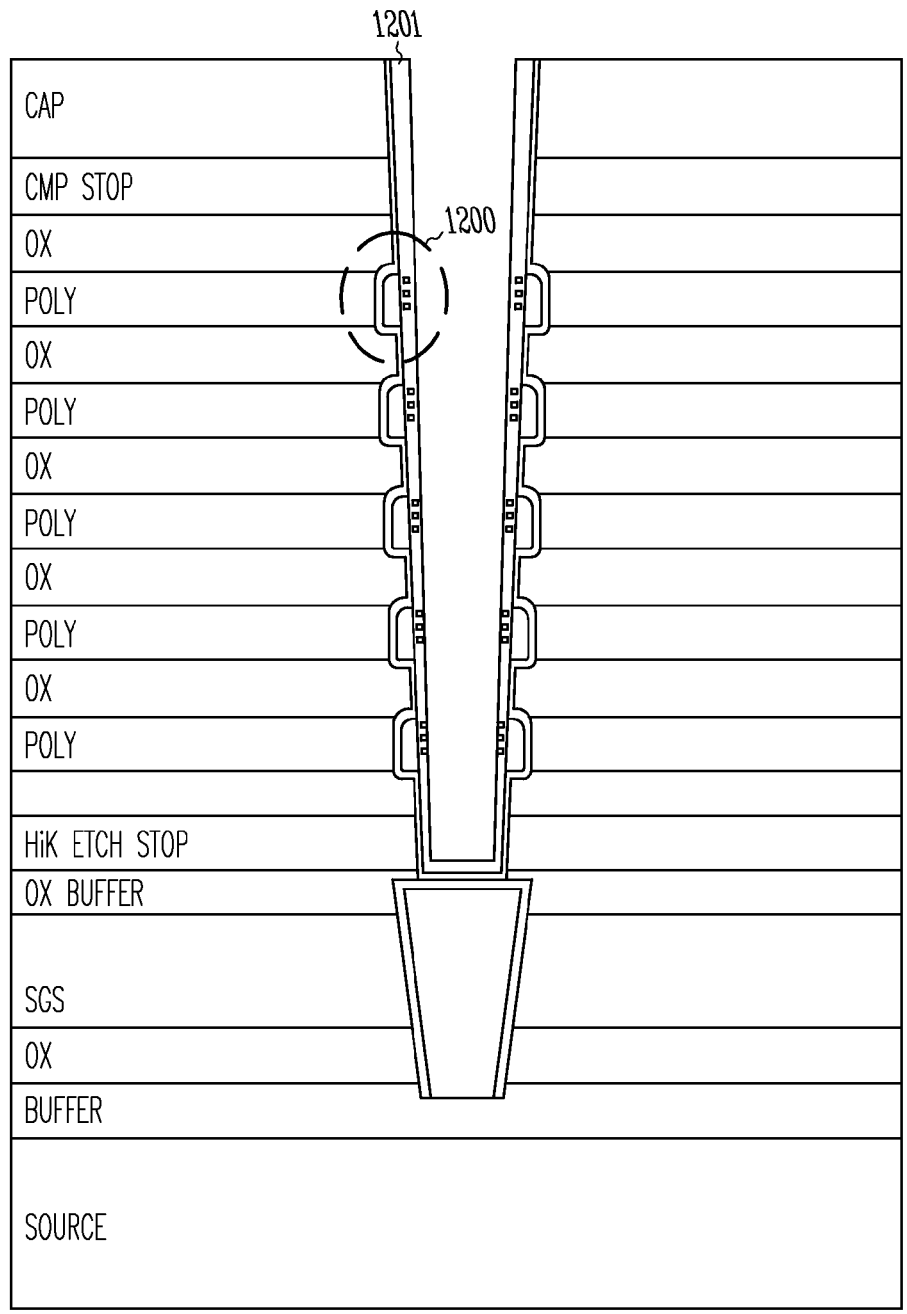
FIG. 12 illustrates additional fabrication steps for forming vertical strings of memory cells.

FIG. 12 illustrates an additional fabrication step for forming vertical strings of memory cells. A tunnel dielectric material 1201 (e.g., oxide) can be formed on the sidewalls and bottom of the channel. The metal nanoparticles can also be covered by the tunnel dielectric material 1201. The tunnel dielectric material 1201 can be an oxide that is grown on the channel surfaces by an oxidation process or deposited. One memory cell 1200 from the resulting string of memory cells is shown in FIG. 13 and described in greater detail subsequently.

Figure 13:
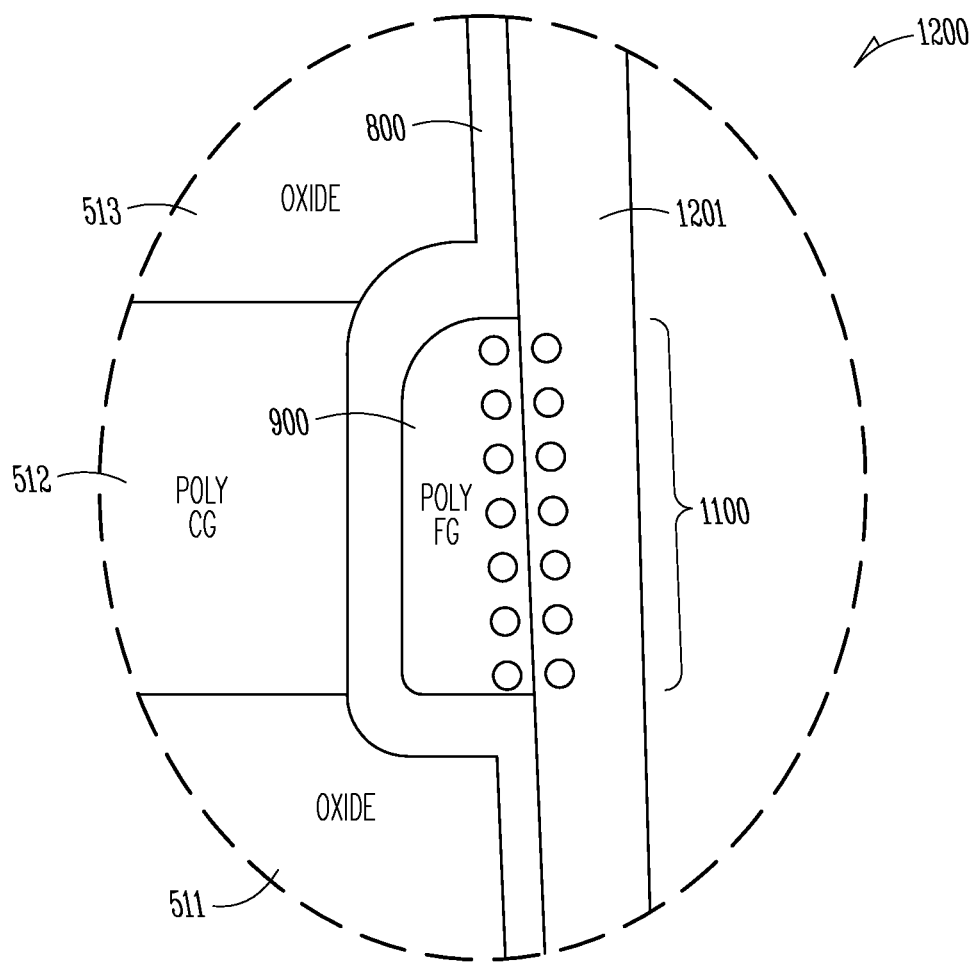
FIG. 13 illustrates a more detailed view of a structure resulting from the fabrication steps of FIGS. 11 and 12.

FIG. 13 illustrates a more detailed view of a planar memory cell structure 1200 resulting from the previous fabrication steps. This detailed view shows the polysilicon filled (e.g., floating gate) recess 700 formed in the polysilicon control gate 512 between the oxide isolation material 511, 513. The recess 700 is lined with the interpoly dielectric material 800 (e.g. ONO). The metal nano-particles 1100 can be formed along the floating gate material surface and/or infused into the floating gate material and covered with the tunnel dielectric material 1201 (e.g., oxide). The metal nano-particles can also be infused throughout the floating gate material but not necessarily along the surface.

Accordingly, the metal along an interface between the tunnel dielectric and the floating gate material in a memory cell in the vertical strings of memory cells can comprise:
(i) metal nano-particles diffused into the floating gate material;
(ii) metal nano-particles covered by the tunnel dielectric;
(iii) metal nano-particles on the surface of the floating gate material adjacent the tunnel dielectric material;
(iv) metal nano-particles in the tunnel dielectric material and metal nano-particles diffused into the floating gate material;
(v) metal nano-particles in the tunnel dielectric material and metal nano-particles on the surface of the floating gate material adjacent the tunnel dielectric material;
(vi) metal nano-particles diffused into the floating gate material and metal nano-particles on the surface of the floating gate material adjacent the tunnel dielectric material; and
(vii) metal nano-particles diffused into the floating gate material, metal nano-particles on the surface of the floating gate material adjacent the tunnel dielectric material, and metal nano-particles in the tunnel dielectric material.

Figure 14:
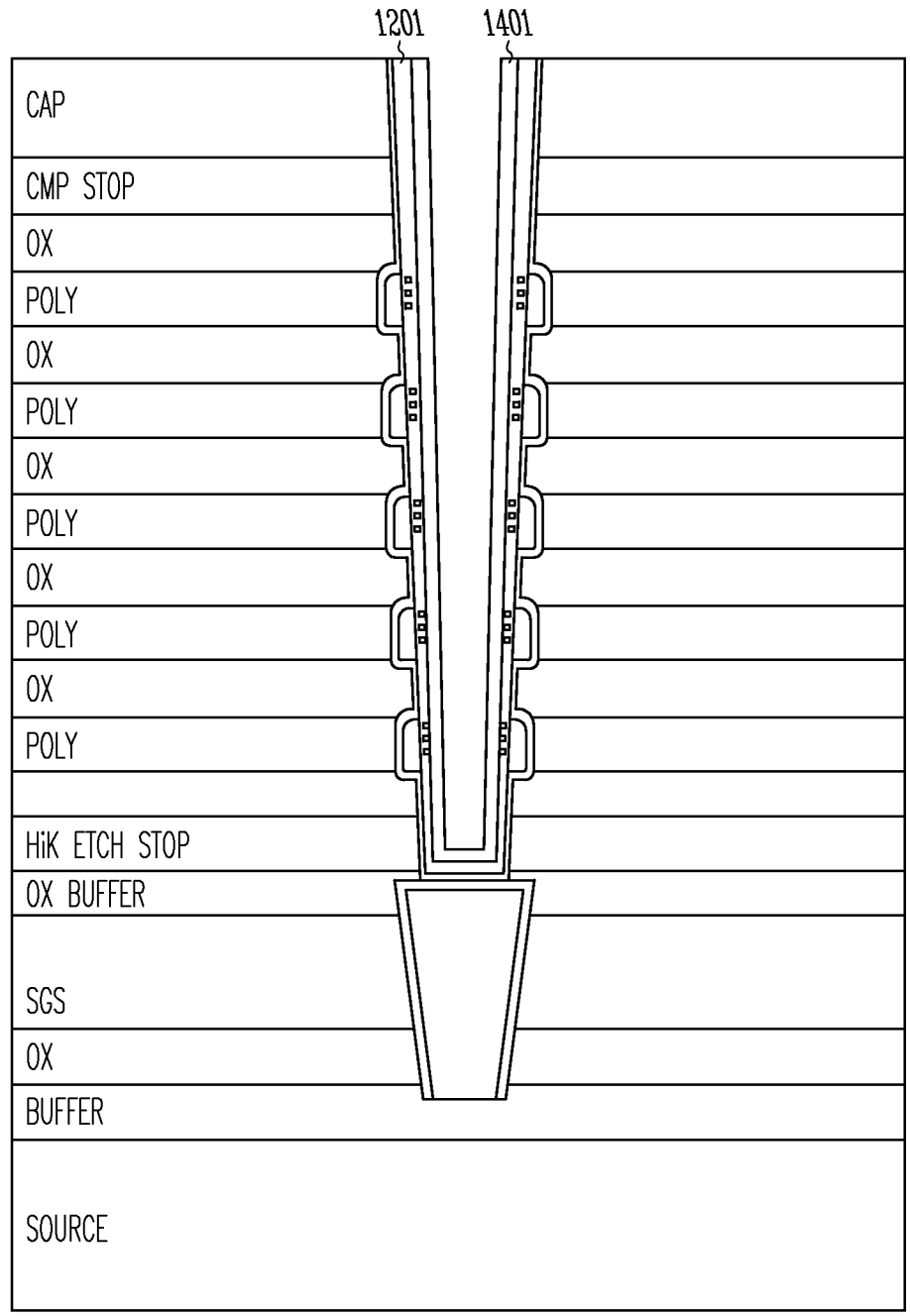
FIG. 14 illustrates additional fabrication steps for forming vertical strings of memory cells.

FIG. 14 illustrates an additional fabrication step for forming vertical strings of memory cells. A sacrificial polysilicon material 1401 can be formed on the sidewalls and bottom of the channel over the oxide material 1201 of the previous step. This layer can be used to protect the previously formed oxide over the metal nano-particles during a subsequent etching process. At least portions of the sacrificial polysilicon material 1401 may be removed during the subsequent etching process.

Figure 15:
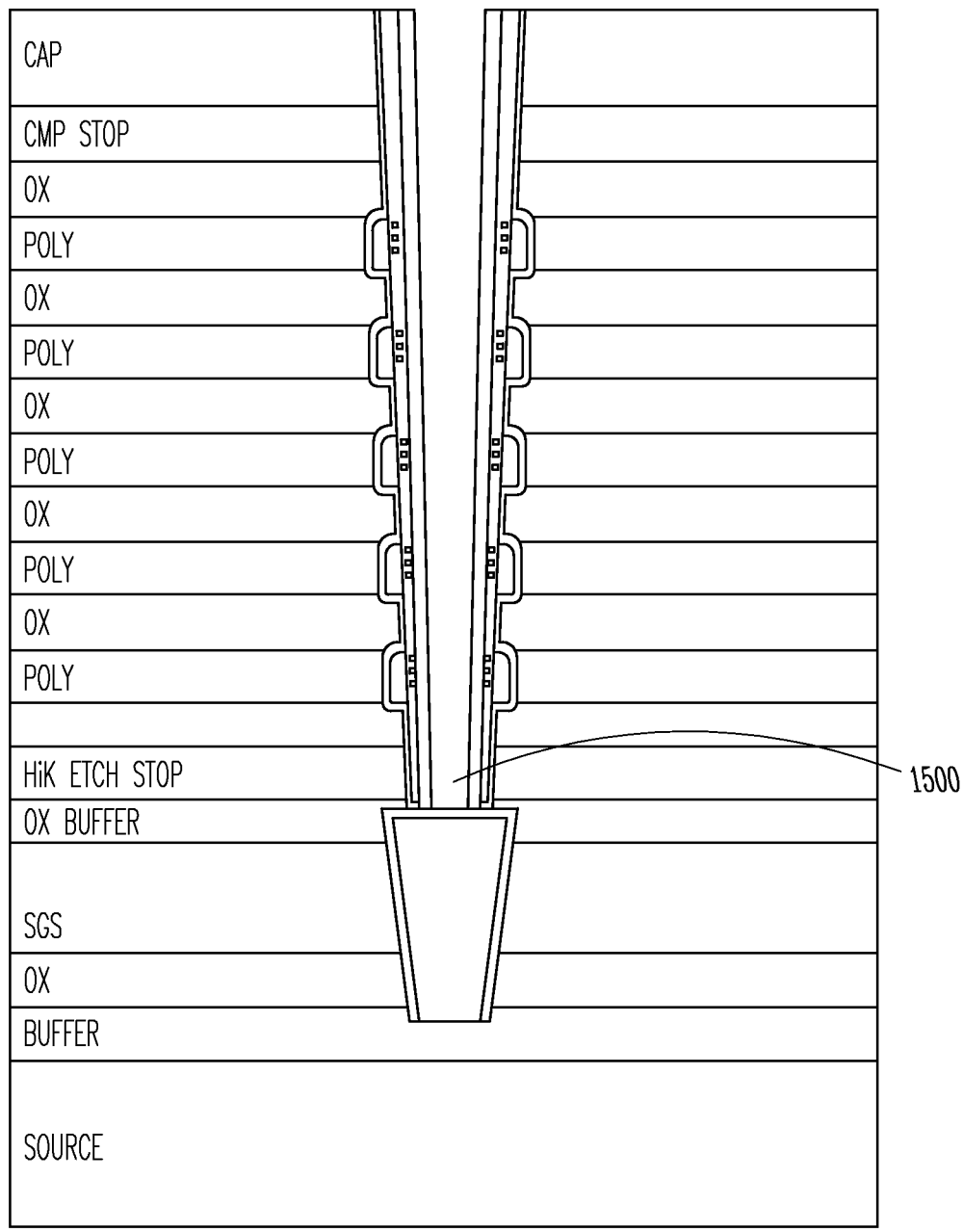
FIG. 15 illustrates additional fabrication steps for forming vertical strings of memory cells.

FIG. 15 illustrates an additional fabrication step for forming vertical strings of memory cells. The layers of polysilicon material and interpoly dielectric material, formed from previous steps, can be removed from the bottom 1500 of the channel. In one embodiment, a dry etch process can be used to remove the bottom materials. At least portions of the sacrificial polysilicon material from the previous step may be removed during this process.

Figure 16:
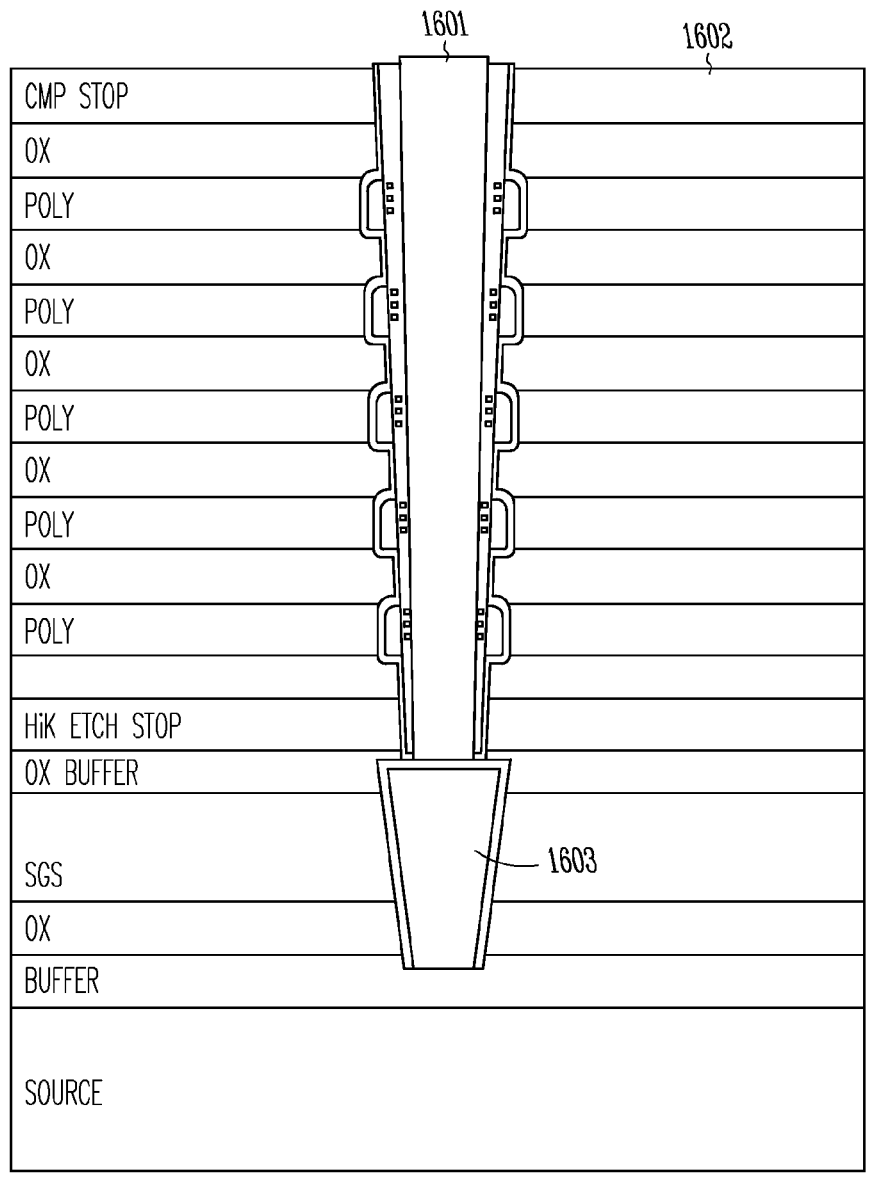
FIG. 16 illustrates additional fabrication steps for forming vertical strings of memory cells.

FIG. 16 illustrates additional fabrication steps for forming vertical strings of memory cells. The channel can be filled with a semiconductor material 1601 (e.g., polysilicon) to act as a memory cell channel for the string of memory cells. The channel fill is coupled to the isolated SGS material 1603. The isolated SGS material 1603 can act as the channel for the SGS transistors. A CMP process can then be used to remove the DARC cap and the CMP stop material 1602.

Figure 17:
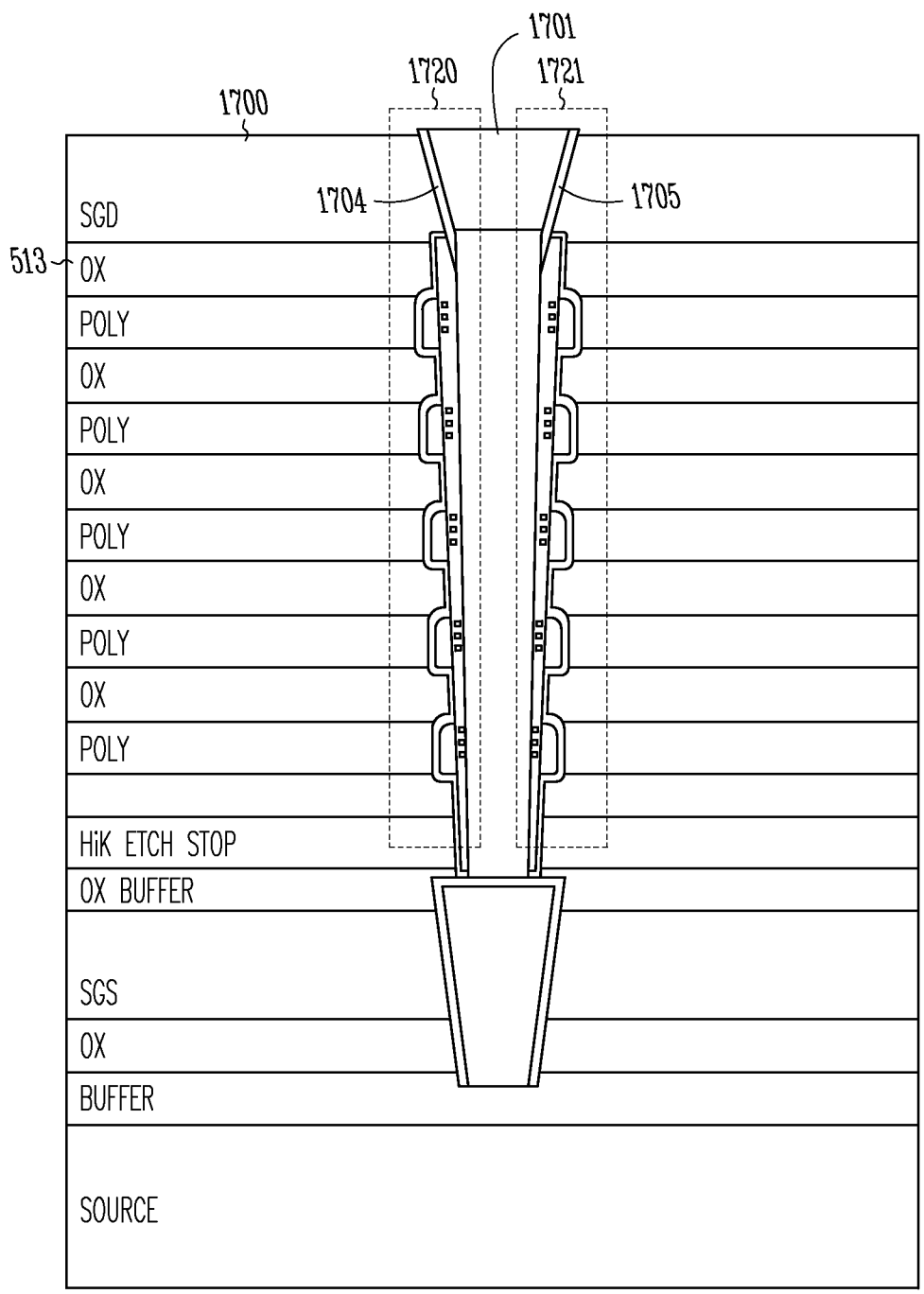
FIG. 17 illustrates additional fabrication steps for forming vertical strings of memory cells.

FIG. 17 illustrates additional fabrication steps for forming vertical strings of memory cells. A polysilicon material 1700 can be formed on the now exposed top oxide material 513 to form the drain select gate SGD. The polysilicon material 1700 can then be etched to form a trench 1701 over the channel fill 1601. An oxide material 1704, 1705 can then be formed along the sidewalls of the trench 1701 to isolate the SGD portion 1700 of the polysilicon material. The trench 1701 can then be filled with a semiconductor material (e.g., polysilicon) so that it is coupled to the channel fill. The isolated SGD trench fill 1701 can then act as the channel for the SGD transistors.

The resulting structure illustrated in FIG. 17 includes two strings of memory cells 1720, 1721 such as the strings illustrated in FIG. 2. This structure can be repeated to form a memory array of vertical strings of memory cells. The semiconductor material 1601 that fills the channel also couples the two strings of memory cells 1720, 1721.

Figure 18:
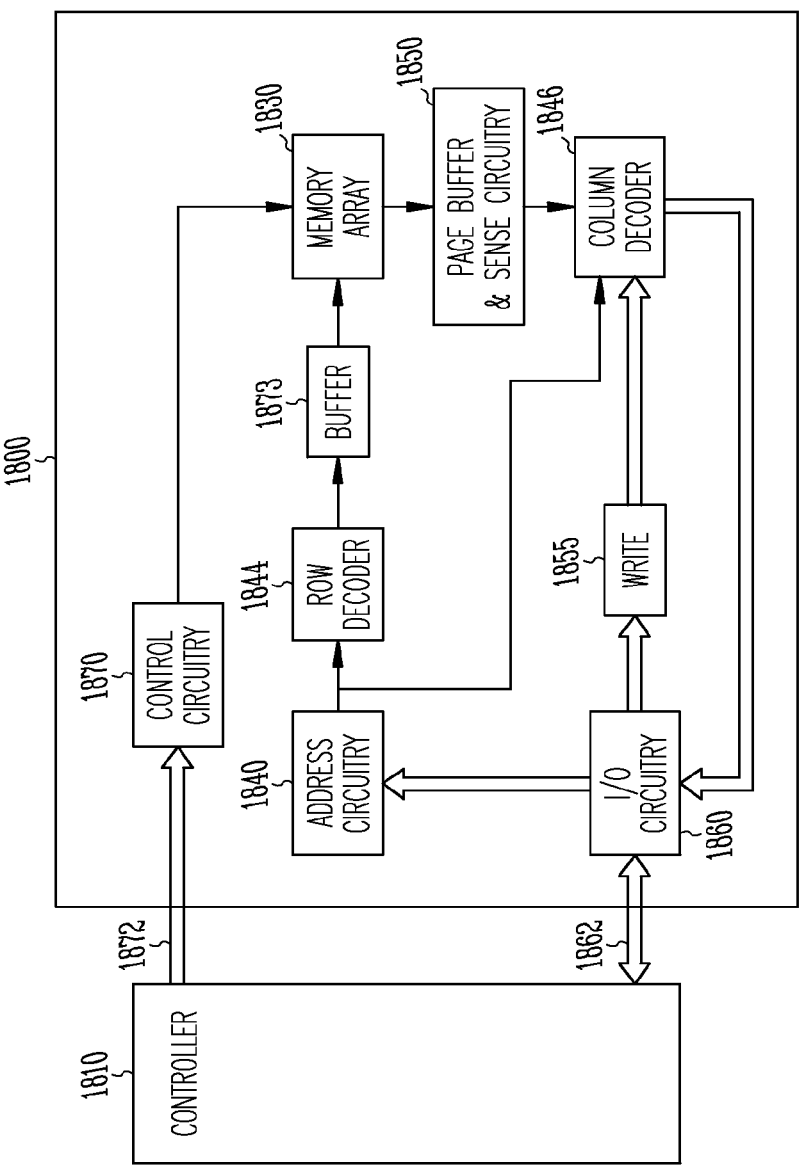
FIG. 18 illustrates a block diagram of a system.

FIG. 18 illustrates a block diagram of one embodiment of a system 1820. The system 1820 includes a memory device 1800 that can comprise a memory array architecture such as the one illustrated in FIG. 2 using the vertical string of memory cell structure of FIG. 17.

The memory device 1800 is coupled to an external controller 1810 (e.g., microprocessor). The external controller 1810 can be configured to transmit commands (e.g., write, read) and control signals to the memory device 1800.

The memory device 1800 includes an array 1830 of memory cells (e.g., NAND architecture non-volatile memory cells). The memory array 1830 is arranged in banks of word line rows and bit line columns. In one embodiment, the columns of the memory array 1830 can comprise the vertical strings of memory cells.

Address buffer circuitry 1840 is provided to latch address signals provided through I/O circuitry 1860 from the external controller 1810. Address signals are received and decoded by a row decoder 1844 and a column decoder 1846 to access the memory array 1830. A row buffer 1873 can be used to buffer data prior to input to the memory array 1830.

The memory device 1800 reads data in the memory array 1830 by sensing voltage or current changes in the memory array columns using sense circuitry/page buffers 1850. The sense circuitry/page buffers 1850 are coupled to read and latch a row of data from the memory array 1830. Data are input and output through the I/O circuitry 1860 for bidirectional data communication as well as the address communication over a plurality of data connections 1862 with the controller 1810. Write circuitry 1855 is provided to write data to the memory array 1830.

Control circuitry 1870 decodes signals provided on a control interface 1872 from the external controller 1810. These signals are used to control the operations of the memory device 1800, including data sense (e.g., read), data write (e.g., program), and erase operations. The control circuitry 1870 may be a state machine, a sequencer, or some other type of control circuitry that is configured to control generation of memory control signals.

CONCLUSION

One or more embodiments can provide a planar memory cell structure in a vertical (e.g., three dimensional) string of memory cell that can increase memory density from horizontally formed memory cells. By integrating metal nano-particles on and/or infused into the floating gate structure, performance enhancements may be achieved.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory apparatus, comprising:
    a vertical string of memory cells formed at least partially in a stack of materials comprising a plurality of alternating levels of control gate material and insulator material;
    wherein the stack of materials further comprises, beneath the alternating levels of control gate material and insulator material, a source, a source gate select (SGS) level above the source, a first oxide level above the SGS level, a high-K dielectric level on the first oxide level, and a second oxide level on the high-K dielectric level;
    a first semiconductor material filling a trench in the SGS level, the first semiconductor material isolated from the material of the SGS level to form a channel for SGS transistors; the first semiconductor material located beneath at least a portion of the high-K dielectric level;
    wherein the memory cells of the string comprise,
        floating gate material comprising polysilicon, the floating gate material located between respective alternating layers of insulator material and having a first surface adjacent to respective control gate material of the levels of control gate material extending between such respective alternating layers of insulator material;
        tunnel dielectric material contacting the floating gate material, on a second surface opposite the first surface of the floating gate material;
        metal along an interface between the tunnel dielectric material and the floating gate material, wherein the metal comprises metal nano-particles infused into the floating gate material; and
    a second semiconductor material adjacent to the tunnel dielectric material, the second semiconductor material forming a memory cell channel for the string of memory cells, the second semiconductor material coupled to the first semiconductor material.

2. The apparatus of claim 1, wherein the control gate material comprises polysilicon, the apparatus further comprising interpoly dielectric material formed between the level of control gate material and the floating gate material.

3. The apparatus of claim 1, wherein metal along an interface between the tunnel dielectric and the floating gate further comprises metal nano-particles covered by the tunnel dielectric.

4. The apparatus of claim 1, wherein metal along an interface between the tunnel dielectric material and the floating gate material further comprises metal nano-particles on the surface of the floating gate material.

5. The apparatus of claim 1, wherein metal along an interface between the tunnel dielectric material and the floating gate material further comprises metal nano-particles on the surface of the floating gate material and covered by the tunnel dielectric material.

6. The apparatus of claim 1, wherein the apparatus comprises a system including a controller coupled to a memory device including the string of memory cells.

7. An apparatus, comprising:
    levels of control gate material insulated from adjacent levels of control gate materials by alternating levels of insulator material;
    additional levels of material beneath the alternating levels of control gate material and insulator material, comprising a source level, a source gate select (SGS) level above the source level, a first oxide level above the SGS level, a high-K dielectric level on the first oxide level, and a second oxide level on the high-K dielectric level;
    a first semiconductor material filling a trench in the SGS level, the first semiconductor material isolated from the material of the SGS level to form a channel for SGS transistors; the first semiconductor material located beneath at least a portion of the high-K dielectric level;
    a string of memory cells formed between the alternating layers of insulating material, comprising,
        recesses in the levels of control gate material;
        respective dielectric material in the recesses adjacent to the control gate material;
        respective floating gate material comprising polysilicon in the recesses;
        tunnel dielectric material contacting the floating gate material, with the floating gate material extending within the respective recess and between the tunnel dielectric material and the dielectric material adjacent the control gate material; and
        metal nano-particles disposed along an interface between the tunnel dielectric material and the floating gate material, including metal nano-particles infused into the floating gate material; and
    a second semiconductor material adjacent to the tunnel dielectric material of the memory cells, the second semiconductor material forming a memory cell channel for the string of memory cells, the second semiconductor material coupled to the first semiconductor material.

8. The apparatus of claim 7, further comprising levels of insulator material alternating between adjacent levels of control gate material.

9. The apparatus of claim 7, wherein the dielectric material is an oxide-nitride-oxide film.

10. The apparatus of claim 7, wherein the metal nano-particles comprise one or more of:
    ruthenium (Ru), ruthenium oxide ($RuO_x$, titanium nitride (TiN), titanium aluminum nitride (TiAlN), tungsten nitride (WN), tungsten carbon nitride (WCN), tungsten silicide ($WSi_x$), tantalum nitride (TaN), tantalum aluminum nitride (TaAlN),ruthenium silicide (RuSi), hafnium silicide (HfSi), hafnium (Hf), zirconium (Zr), zirconium silicide (ZrSi), cobalt silicide (CoSi), or nickel silicide (NiSi).

11. The apparatus of claim 7, wherein the floating gate material comprises a polysilicon material.

12. The apparatus of claim 7, wherein the metal is a nitridization stabilized metal.

13. The apparatus of claim 1, further comprising a buffer level above the source and beneath the SGS level.

14. The apparatus of claim 1, wherein the buffer level comprises polysilicon.

15. The apparatus of claim 1, further comprising an insulator level above the source and beneath the SGS level.

16. The apparatus of claim 1, further comprising a buffer level comprising polysilicon located between the source and the insulator level; wherein the first semiconductor material extends through the insulator level to contact the buffer level.

17. The apparatus of claim 1, further comprising dielectric material formed between the control gate material and the floating gate material.

* * * * *